US007255246B2

(12) United States Patent
Bautista et al.

(10) Patent No.: US 7,255,246 B2
(45) Date of Patent: Aug. 14, 2007

(54) ULTRASONIC SENSOR FOR DETECTING THE DISPENSING OF A PRODUCT

(75) Inventors: Dexter V. Bautista, Augusta, GA (US); Thomas Roger Meinardi, Aiken, SC (US); Joshua Robert Powell, Aiken, SC (US)

(73) Assignee: Dixie-Narco, Inc., Williston, SC (US)

( * ) Notice: Subject to any disclaimer, the term of this patent is extended or adjusted under 35 U.S.C. 154(b) by 222 days.

(21) Appl. No.: 10/678,186

(22) Filed: Oct. 6, 2003
(Under 37 CFR 1.47)

(65) Prior Publication Data

US 2005/0043856 A1 Feb. 24, 2005

Related U.S. Application Data

(60) Provisional application No. 60/415,771, filed on Oct. 4, 2002.

(51) Int. Cl.
*G07F 11/10* (2006.01)
*H01L 41/00* (2006.01)

(52) U.S. Cl. ...................................... 221/133; 310/335

(58) Field of Classification Search ................ 221/133, 221/3, 9, 13, 129; 194/200, 201, 202, 203, 194/204; 367/118, 136
See application file for complete search history.

(56) References Cited

U.S. PATENT DOCUMENTS

| | | | | |
|---|---|---|---|---|
| 3,569,924 | A * | 3/1971 | Drake et al. | 367/93 |
| 4,359,147 | A * | 11/1982 | Levasseur | 194/200 |
| 4,784,251 | A | 11/1988 | De Woolfson et al. | |
| 4,869,392 | A * | 9/1989 | Moulding et al. | 221/1 |
| 5,355,987 | A | 10/1994 | De Woolfson et al. | |
| 5,465,822 | A | 11/1995 | De Woolfson et al. | |
| 5,477,953 | A | 12/1995 | Powell et al. | |
| 5,913,399 | A * | 6/1999 | Takemoto et al. | 194/200 |
| 5,927,539 | A * | 7/1999 | Truitt et al. | 221/2 |
| 6,384,402 | B1 | 5/2002 | Hair, III et al. | |
| 6,640,994 | B2 * | 11/2003 | Chen | 221/2 |
| 6,749,052 | B2 * | 6/2004 | Carmichael | 194/201 |
| 2001/0000408 | A1 | 4/2001 | Hair, III et al. | |

FOREIGN PATENT DOCUMENTS

| | | |
|---|---|---|
| JP | 407160935 | 6/1995 |
| JP | 407249161 | 9/1995 |
| JP | 2001221677 | 8/2001 |

* cited by examiner

*Primary Examiner*—Patrick Mackey
*Assistant Examiner*—Mark J. Beauchaine

(57) ABSTRACT

A vending machine includes a vend sensor for detecting a completion of a vend operation. The vend sensor includes an electronic circuit connected to first and second sound elements positioned on opposing sides of a product delivery chute of the vending machine. The first sound element directs a sound beam across the product delivery chute where it is received by the second sound element. During a vend operation, a product container is guided to the product delivery chute to be dispensed to a consumer. As the container passes through the product delivery chute, the sound beam is interrupted, thereby signaling the completion of a vend operation. Each of the first and second sound elements is provided with a cone that focuses the sound beam so as to limit interruptions stemming from outside sound sources.

20 Claims, 4 Drawing Sheets

ULTRASONIC SENSOR FOR DETECTING THE DISPENSING OF A PRODUCT

CROSS-REFERENCE TO RELATED APPLICATIONS

The present application claims benefit of U.S. Provisional Patent Application Ser. No. 60/415,771 entitled "ULTRASONIC SENSOR FOR DETECTING THE DISPENSING OF A PRODUCT" filed on Oct. 4, 2002.

BACKGROUND OF THE INVENTION

1. Field of the Invention

The present invention pertains to the art of vending machines and, more particularly, to an ultrasonic sensor for detecting passage of a product container to a delivery portion of the vending machine.

2. Discussion of the Prior Art

Traditional can and bottle vending machines utilize various motors to move mechanisms in the form of cams and the like. In turn, the mechanisms release stored product from within a stack or storage rack arranged within the vending machine. Typically, a consumer inserts currency into a receptacle and thereafter makes a product selection. At this point, a controller operates a delivery mechanism which delivers the selected product to the consumer.

In typical vending machines, once the vending operation is complete, a refund of the consumer's currency is not possible. Therefore, if the machine fails to dispense the product, the consumer must seek recourse with the vending machine company, or to the company that services the particular machine. In any event, return of lost money due to the machine's failure to dispense product is a laborious process, the cost of which generally exceeds the amount of the consumer's loss.

Therefore, there exists a need in the art of vending machines for a sensor to detect the occurrence of a vending operation. More specifically, there exists a need in the art for an ultrasonic sensor capable of determining that a dispensed product reaches the consumer.

SUMMARY OF THE INVENTION

The present invention is directed to a vending machine including a vend sensor for detecting the passage of a vended product. More specifically, the sensor includes an electronic circuit interconnected with a speaker and a microphone that operate at frequencies above human hearing. Product containers rolling, or passing between the speaker and the microphone decreases the volume, or changes a period, of a distinct sound generated from the speaker. The electronic circuit detects this change in signal and sends a product detect signal to a main controller.

In a preferred form of the present invention, the electronic circuit includes water resistant ultrasonic transducers that operate over a frequency range having a 40 kHz center frequency. Preferably, the electronic circuit includes a receiver, an amplitude detector, a phase detector, e.g., or Phase Lock Loop (PLL) semi-conductor chip, and a logic circuit to detect the presence or non-presence of the 40 kHz sound waves generated by the transducer. The receiver amplifies the signal and subsequently passes the amplified signal to the phase and amplitude detectors. Once received, the logic circuit determines if the signal has changed in period or if the signal strength is below a predetermined threshold. In this manner, the logic circuit can filter out background noise which may result in false positive signals. If the signal has changed in period or the signal strength is below a predetermined threshold level, an open collector transistor is toggled to conduct to ground. The open collector signal constitutes the vend detect signal sent to the main controller.

In further accordance with the preferred form of the invention, the speaker and microphone are housed in separate, axially aligned, cones, preferably formed from plastic. Each cone faces an opposing cone such that sound generated from the speaker housed in a speaker cone reaches the microphone housed in the microphone cone. With this arrangement, the cones focus the ultrasonic signal toward the receiver or microphone unit. Focusing in this manner generally boosts the volume of the transmitter which ultimately dampens the reception of background ultrasonic noise.

Additional objects, features and advantages of the present invention will become more readily apparent to one of ordinary skill in the art from the following detailed description of a preferred embodiment taken in conjunction with the following drawings wherein like reference numerals refer to corresponding ports in the several views.

DETAILED DESCRIPTION OF THE PREFERRED EMBODIMENT

Figure 1:
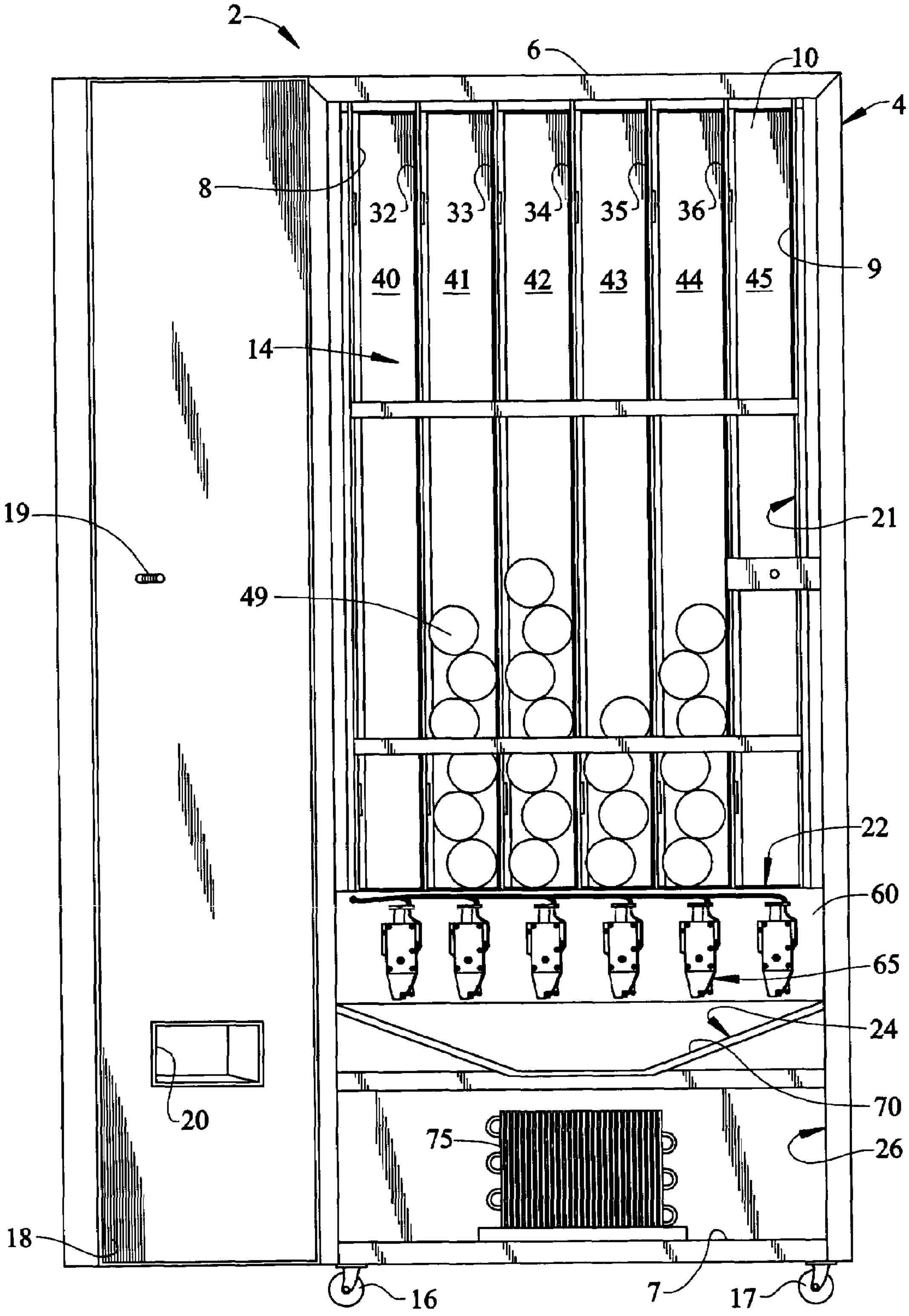
FIG. 1 is a plan view of a vending machine showing a main door in an open position exposing internal structure of the machine including an ultrasonic vend sensor arranged in a product delivery chute in accordance with the present invention.

With initial reference to FIG. 1, a vending machine 2 includes a cabinet frame 4 having top, bottom, side and rear walls 6–10 that collectively define a central cavity 14. In a manner known in the art, a first pair of wheels or casters 16 and 17 are secured to a front edge portion of bottom wall 7 to facilitate the positioning of vending machine 2. Of course it should be realized that a second pair of wheels (not shown) are also arranged on a rear portion of bottom wall 7. A door 18 is pivotally mounted to cabinet frame 4 to selectively enable access to central cavity 14 in order to load various product containers or other commodities into vending machine 2. Door 18 is provided with a locking mechanism, shown in the form of a threaded rod 19, to retain door 18 in a closed position so as to prevent pilfering of the commodities from central cavity 14. Door 18 is also provided with an opening 20 to enable a consumer to remove a vended product container or other commodity from vending machine 2.

Central cavity 14 includes a storage section 21, a dispensing section 22, a delivery section 24 and a lower section 26. Storage section 21 is provided to hold products in escrow until a vending operation is performed. Towards that end, storage section 21 is provided with a plurality of vertically extending column walls 32–36 which, together with side walls 8 and 9, form a plurality of column or stack areas 40–45. In the embodiment shown in FIG. 1, stack areas 40–45 constitute single stack columns. However, it should be understood that the present invention also encompasses vending machines having multi-stack columns. In any event, stack areas 40–45 are partitioned by walls 32–36 to contain, separate and support a plurality of generally cylindrical containers 49 which, in the embodiment shown, constitute soda cans.

As further shown in FIG. 1, dispensing section 22 is provided with a frontal support wall 60 having arranged thereon a plurality of vend motors, one of which is indicated at 65. As will be discussed more fully below, a plurality of cradles (not shown) are arranged behind frontal support wall 60. Actually, each column or stack area 40–45 is provided with an associated cradle (not shown) that is operated through a respective one of the plurality of vend motors 65. Upon selection of a particular product container 49 or other commodity, one of the plurality of vend motors 65 is activated to rotate a respective cradle causing a product container 49, corresponding to the selected product to emerge from vending machine 2. That is, product container 49 is transported to a product delivery chute 70 provided in delivery section 24 which is exposed to opening 20 in door 18. In order to maintain containers 49 in a refrigerated state, lower section 26 is provided with a cooling system 75. In general, the above description is provided for the sake of completeness and to enable a better understanding of the invention. The present invention is particularly directed to the incorporation of a vend sensor for detecting that a product has been dispensed from vending machine 2.

Figure 2:
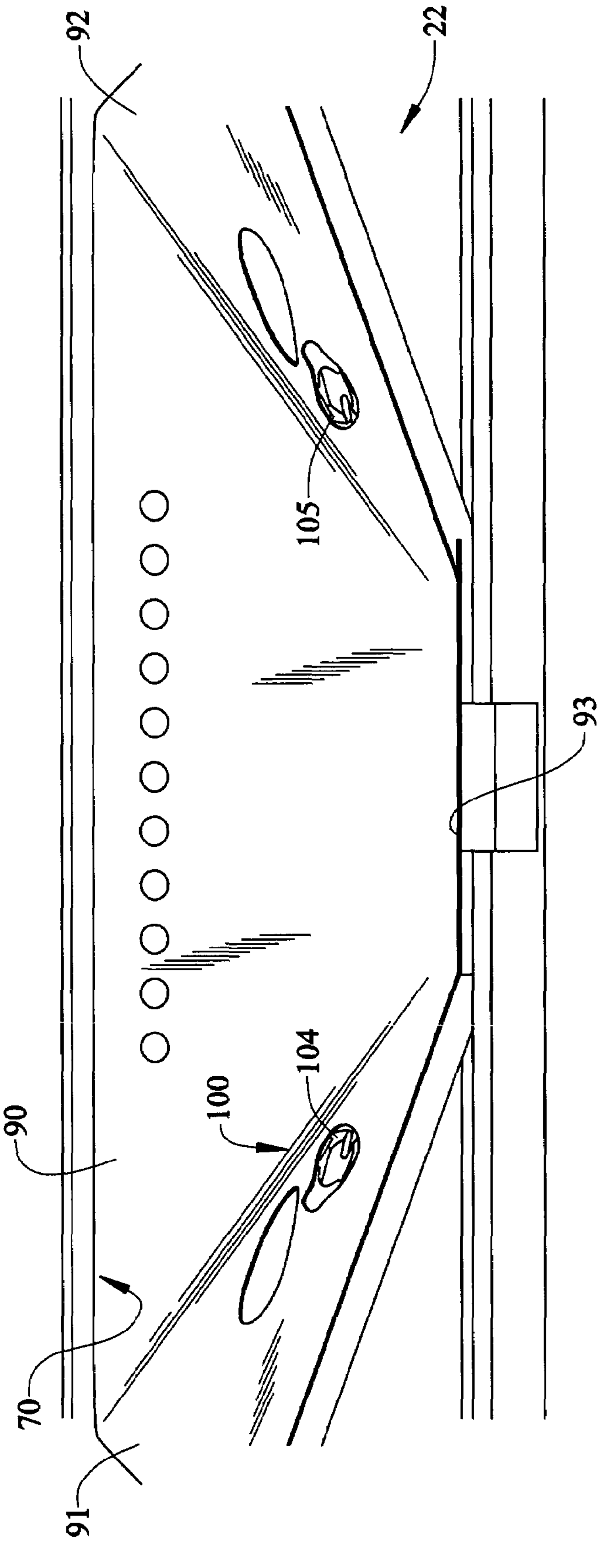
FIG. 2 is an enlarged view of the product delivery chute of the vending machine of FIG. 1 showing the particular arrangement of the vend sensor of the present invention.

With particular reference to FIG. 2, product delivery chute 70 includes a back wall 90 that interconnects with first and second side walls 91 and 92. Preferably, back wall 90 and side walls 91 and 92 slope downward and inward toward a bottom wall portion 93 which, in turn, is adapted to lead to opening 20. In accordance with a preferred embodiment of the present invention, a vend sensor 100 is located in product delivery chute 70 to detect the passing of a product container 49 from storage section 21 to dispensing section 22. More specifically, vend sensor 100 includes first and second sound elements 104 and 105 which, as will be discussed more fully below, establish a sound zone that extends across product delivery chute 70.

Figure 3:
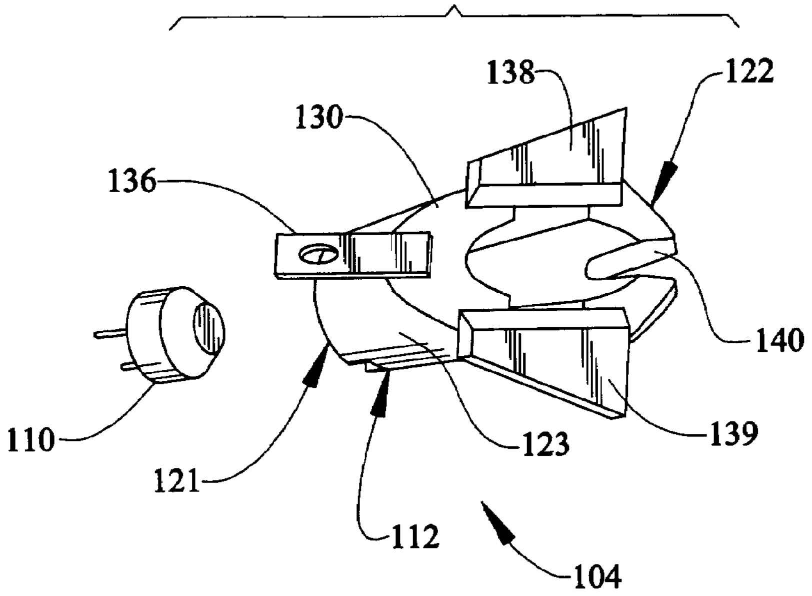
FIG. 3 is a exploded view showing the vend sensor of the present invention.

Reference will now be made to FIG. 3 in describing the specific structure of sound elements 104 and 105. As shown, sound element 104 includes a sound device 110 which, in the embodiment shown, is constituted by a speaker or other sound emitter. Sound device 110 is positioned within a cone member 112 that operates to focus a sound beam which originates at sound element 104 and passes to sound element 105 having a sound device in the form of a microphone or sound receiver. Cone member 112 also provides a water resistant barrier for sound element 110. More specifically, cone member 112 includes a first end 121, a second end 122, and a hollow main body portion 123 therebetween. In accordance with the most preferred embodiment of the present invention, second end 122 includes an angled face portion 130 which aids in positioning cone member 112 in product delivery chute 70. Towards that end, angled face portion 130 is provided with a mounting bracket 136 having an aperture (not separately labeled) for receiving a mechanical fastener for securing cone member 112 to side wall 91. Angled face portion 130 is also provided with a pair of opposing positioning ears 138 and 139 which combine with angled face portion 130 to establish a proper alignment between first and second sound elements 104 and 105. In addition, second end 122 has formed therein a notch 140 that aides in focusing the sound beam to establish the sound zone that extends between first and second sound elements 104 and 105.

Figure 4:
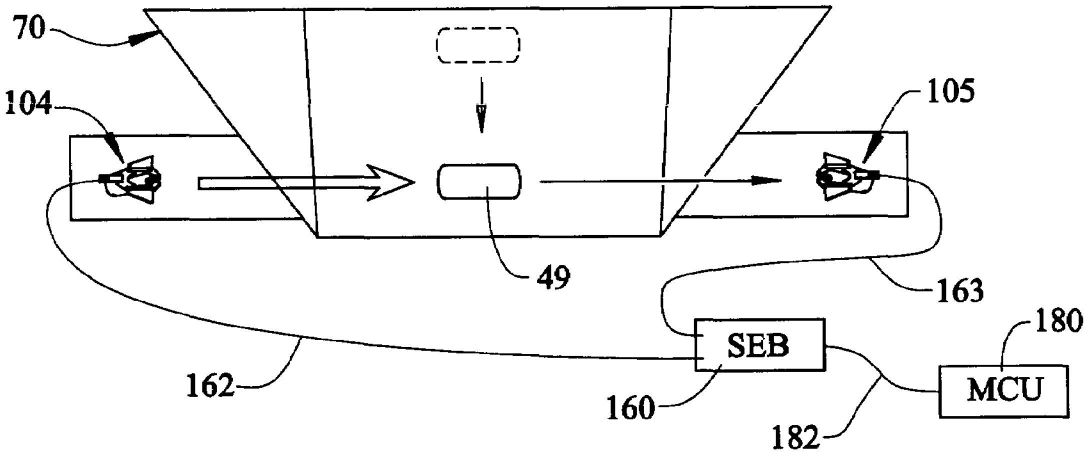
FIG. 4 is a diagram depicting a product passing the vend sensor of the present invention.

As best illustrated in FIG. 4, first sound element 104 projects or emits a sound beam that is focused through cone member 112 and directed toward second sound element 105, which has an associated correspondingly constructed cone member 112. In this manner, a sound beam can be passed between first and second sound elements 104 and 105 to form a sound zone for the detection of products passing through product delivery chute 70. Cone member 112 directs the sound beam in such a manner as to minimize the effects of outside interferences. First and second sound elements 104 and 105 are interconnected to a sensor electronic board or SEB 160 through first and second control leads 162 and 163. SEB 160 supplies first sound element or speaker 104 with a sound signal of particular frequency through lead 162. The sound beam passes from first sound element 104 across product delivery chute 70 to second sound element 105. Once received by sound element 105, the sound beam or, more accurately, a signal representative of the sound beam, is passed through lead 163 back to SEB 160. In the event that the sound beam is interrupted or distorted, or second sound element 105 detects a change in the sound beam, SEB 160 passes a signal to a main control unit 180 through a control lead 182 to signal the completion of a vend operation. Once main control unit 180 receives the vend completion signal, currency is collected and any change passed to the consumer.

Figure 5:
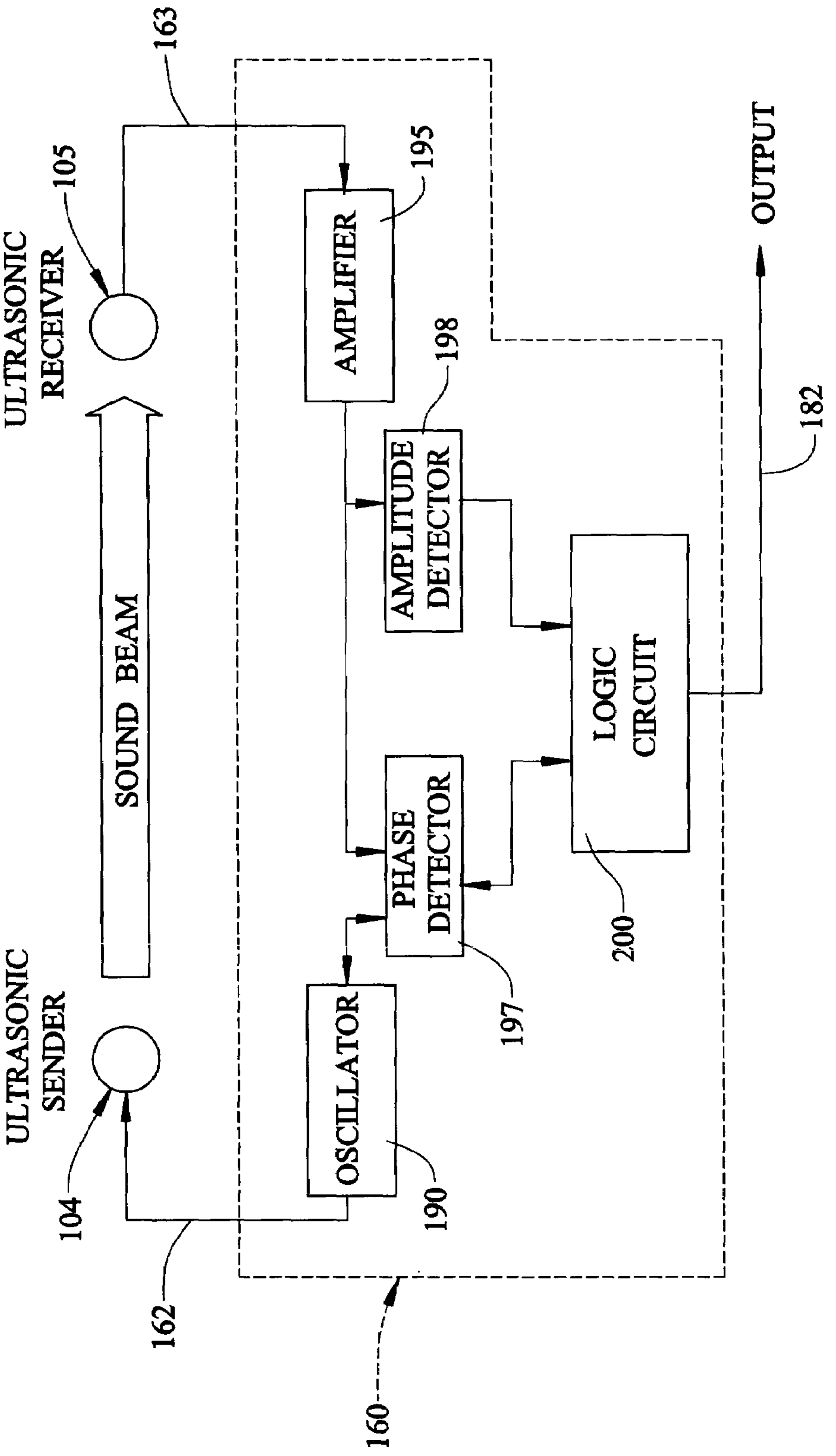
FIG. 5 is a block diagram depicting the operation of the vend sensor of FIG. 1.

Referring to FIG. 5, SEB 160 includes an oscillator 190 that produces a sound signal preferably having a center frequency of approximately 40 kHz. The sound signal is passed to first sound element 104 which projects a sound beam to second sound element 105. Upon receipt of the sound beam, a signal is passed through lead 163 to an amplifier 195. Amplifier 195 amplifies, and then passes, the signal to a phase detector or PLL semiconductor chip 197 and an amplitude detector 198. Phase detector 197 determines a particular period of the signal, while amplitude detector 198 determines a strength of the signal. Both the signal period and the signal strength are then passed to a logic circuit 200. Logic circuit 200 detects the presence and period of the approximately 40 kHz frequency generated by oscillator 190. More specifically, logic circuit 200 processes the signal and determines if the signal is periodic and whether the signal strength is above a predetermined threshold. If the signal is not periodic, such as through a Doppler shift resulting from a product container passing near to but not through the sound beam, or the signal strength is below the determined threshold, e.g., a product passes through and breaks the sound beam, a completion signal is passed through control lead 182 indicating completion of the vend operation. Upon receipt of the completion signal, main control unit 180 will cease operation of one of the plurality of vend motors 65, collect deposited currency, return any change and terminate the overall vend operation.

At this point, it should be noted that vend sensor 100 also serves as an anti-pilfering device, signaling main control unit 180 of an attempt to retrieve a product or container from storage section 21 through delivery section 24. That is, even if main control unit 180 is not monitoring or performing a vend operation, an interruption of the sound beam passing between first and second control elements 104 and 105 will be sensed by SEB 160. SEB 160 will pass a signal indicative of the disruption in the sound beam to main control unit 180.

A disruption of the sound beam in the absence of a vend operation indicates an attempt is being made to retrieve product from vending machine 2 without payment. In the event that main control 180 receives such a signal, main control unit 180 will lock each vend motor 65 to prevent product containers 49 from being withdrawn from storage section 21. Other alarms or pilfering protection could also be activated.

Through experimentation, it has been found that the presence of cones 112 enable the sound beam to pass across product delivery chute 70 with minimal outside interference. Unlike optical sensors which require a very narrow beam, cones 112 enable the use of a rather broad beam across a wider detection region. It has been found through experimentation that outside noises, such as jingling keys or coins, sharp knocks or the like, will not trigger a false dispensing signal. In fact, it has been shown that vend sensor 100 can be used to effectively and accurately detect the passages of products through a detection region even as much as 18 inches (45.72 cm). Finally, the accuracy provided by vend sensor 100 enables main control unit 180 to maintain an accurate count of product remaining in vending machine 2. Therefore, when a particular product is exhausted, a signal can be provided to the consumer without the need for a sold-out paddle. This eliminates additional mechanical components in vending machine 2.

Although described with reference to a preferred embodiment of the present invention, it should be readily apparent to one of ordinary skill in the art that various changes and/or modifications can be made to the invention without departing from the spirit thereof. For instance, the particular form of cones 112 could be altered so long as a focused sound beam is passed between the sound elements, while preferably being shielded from outside interferences. In addition, it should be understood that the passing of a product between the sound elements is but one way to indicate the completion of a vend operation. In the event that a flexible product delivery chute is used, products falling onto the chute could cause the sound elements to become misaligned. The misalignment of the sound elements could then represent the completion of the vend operation. In general, the invention is only intended to be limited to the scope of the following claims.

We claim:

1. A vending machine comprising:

a cabinet frame including top, bottom, side and rear walls that collectively define a central cavity;

a plurality of column walls defining a plurality of stack areas for receiving product containers to be selectively dispensed from the vending machine;

a door pivotally mounted to the cabinet frame, said door adapted to selectively close the central cavity;

a delivery chute for receiving a product container dispensed from the vending machine;

a vend motor for selectively delivering one of the plurality of containers from one of the plurality of columns to the delivery chute;

a control unit for selectively activating the vend motor for a vend operation, said control unit including a sensor electronic control board having an amplitude detector and a phase detector; and a vend sensor electrically connected to the control unit, said vend sensor including first and second sound elements mounted in the container delivery chute between which pass a sound beam wherein, during the vend operation, one of the plurality of product containers passes between the first and second sound elements and disrupts the sound beam which is signaled to the control unit, said control unit processing a signal from the vend sensor and detecting a change in the sound beam to complete the vend operation.

2. The vending machine according to claim 1, wherein the first sound element is a speaker and the second sound element is a microphone.

3. The vending machine according to claim 2, wherein the speaker emits the sound beam, said sound beam having an ultrasonic wavelength.

4. The vending machine according to claim 3, wherein the ultrasonic wavelength has a center frequency of approximately 40 KHz.

5. The vending machine according to claim 2, wherein each of the speaker and the microphone are positioned in respective cones, said cones causing the sound beam to be focused between the first and second sound elements.

6. The vending machine according to claim 5, wherein each of said cones includes an angled face portion that aligns the speaker with the microphone.

7. The vending machine according to claim 6, wherein each of said cones include first and second positioning cars mounted to the angled face portion, said positioning ears, in cooperation with the angled face portion orient each of said cones to the delivery chute.

8. The vending machine according to claim 5, wherein each of said cones includes a mounting bracket that secures said cones to the delivery chute.

9. The vending machine according to claim 5, wherein each of said cones includes a notch that focuses the sound beam between the first and second sound elements.

10. The vending machine according to claim 1, wherein the control unit completes the vend operation if a period of the signal from the vend sensor changes.

11. The vending machine according to claim 1, wherein the control unit completes the vend operation if the signal from the vend sensor is below a predetermined threshold value.

12. The vending machine according to claim 11, wherein the control unit completes the vend operation if the signal from the vend sensor is not periodic.

13. The vending machine according to claim 2, wherein each of the speaker and microphone are water resistant.

14. A method of performing a vend operation in a vending machine comprising:

selecting one of a plurality of products through manipulation of a control element on the vending machine;

activating a vend motor to deliver the selected product from one of a plurality of product stack areas to a dispensing portion of the vending machine;

guiding the selected product to a product delivery chute;

signaling a main controller of the vend operation by directing the selected product passed first and second sound elements between which pass a sound beam;

sensing whether the sound beam passing between the first and second sound elements is periodic; and signaling the main controller of the vend operation if the sound beam passing between the first and second sound elements is not periodic, wherein disruption of the sound beam signals a completion of the vend operation.

15. The method of claim 14, wherein the sound beam that passes between the first and second sound elements is an ultrasonic sound beam.

16. The method of claim 14, further comprising: focusing the sound beam through respective cone members provided as part of the first and second sound elements.

17. The method of claim 14, further comprising: amplifying the sound beam.

18. The method of claim 17, further comprising:

sensing a magnitude of the sound beam passing between the first and second sound elements; and signaling the main controller of the vend operation if the magnitude of the amplified sound beam passing between the first and second sound elements is below the predetermined level.

19. A method of performing a vend operation in a vending machine comprising:

selecting one of a plurality of products through manipulation of a control clement on the vending machine;

activating a vend motor to deliver the selected product from one of a plurality of product stack areas to a dispensing portion of the vending machine;

guiding the selected product to a product delivery chute;

signaling a main controller of the vend operation by directing the selected product passed first and second sound elements between which pass a sound beam, wherein disruption of the sound beam signals a completion of the vend operation; and detecting a disruption of the sound beam in the absence of a selected vend operation wherein said disruption indicates that a product is being removed from the machine without payment.

20. The method of claim 19, further comprising:

scoring whether the sound beam passing between the first and second sound elements is periodic; and signaling the main controller of the vend operation if the sound beam passing between the first and second sound elements is not periodic.

* * * * *